US009455693B2

(12) United States Patent
Ghisu et al.

(10) Patent No.: US 9,455,693 B2
(45) Date of Patent: Sep. 27, 2016

(54) SWITCHING CIRCUIT FOR A TRANSMISSION CHANNEL FOR ULTRASOUND APPLICATIONS, TRANSMISSION CHANNEL AND PROCESS FOR DRIVING A SWITCHING CIRCUIT

(71) Applicant: STMicroelectronics S.r.l., Agrate Brianza (IT)

(72) Inventors: Davide Ugo Ghisu, Milan (IT); Antonio Ricciardo, Vigevano (IT); Sandro Rossi, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 672 days.

(21) Appl. No.: 13/907,493

(22) Filed: May 31, 2013

(65) Prior Publication Data

US 2013/0265855 A1     Oct. 10, 2013

Related U.S. Application Data

(63) Continuation-in-part of application No. PCT/IT2010/000493, filed on Dec. 9, 2010.

(51) Int. Cl.
| | |
|---|---|
| *H03K 17/00* | (2006.01) |
| *H04B 11/00* | (2006.01) |
| *H03K 5/08* | (2006.01) |
| *H03K 17/10* | (2006.01) |
| *H03K 17/687* | (2006.01) |
| *H03K 17/693* | (2006.01) |

(52) U.S. Cl.
CPC ............ *H03K 5/084* (2013.01); *H03K 17/102* (2013.01); *H03K 17/6872* (2013.01); *H03K 17/6874* (2013.01); *H03K 17/693* (2013.01); *H04B 11/00* (2013.01); *H03K 2217/0054* (2013.01)

(58) Field of Classification Search
USPC ......................................................... 367/137
See application file for complete search history.

(56) References Cited

U.S. PATENT DOCUMENTS

| | | | |
|---|---|---|---|
| 4,543,829 A | 10/1985 | Lerch | |
| 6,537,216 B1 * | 3/2003 | Shifrin | ........................ 600/437 |
| 6,759,888 B1 * | 7/2004 | Wodnicki | ...................... 327/382 |
| 6,914,470 B2 * | 7/2005 | Watanabe et al. | ............ 327/333 |

(Continued)

FOREIGN PATENT DOCUMENTS

| | | |
|---|---|---|
| CN | 2726305 Y | 9/2005 |
| CN | 201062850 Y | 5/2008 |

OTHER PUBLICATIONS

International Search Report for PCT/IT2010/000493.*

*Primary Examiner* — James Hulka
(74) *Attorney, Agent, or Firm* — Seed IP Law Group PLLC

(57) ABSTRACT

A switching circuit for transmission channel for ultrasound applications is electrically coupled between a connection terminal and a low voltage output terminal. The switching circuit includes a receiving switch, a high voltage clamp circuit electrically coupled between the connection terminal and a central node, and a low voltage clamping switch electrically coupled between said central node and a reference voltage. The receiving switch is a low voltage switch and is electrically coupled between the central node and the low voltage output terminal. The clamping switch and the receiving switch are controlled in a complementary way with respect to each other. A transmission channel for ultrasound applications includes the switching circuit.

12 Claims, 4 Drawing Sheets

(56) References Cited

U.S. PATENT DOCUMENTS

| | | | |
|---|---|---|---|
| 7,775,979 B2* | 8/2010 | Thomenius et al. | 600/437 |
| 8,648,629 B2* | 2/2014 | Rossi | H03K 19/018521 327/108 |
| 8,710,874 B2* | 4/2014 | Rossi | H03K 19/018521 327/108 |
| 2004/0061521 A1* | 4/2004 | Watanabe et al. | 326/62 |
| 2007/0016026 A1 | 1/2007 | Thomenius et al. | |
| 2008/0264171 A1* | 10/2008 | Wodnicki | 73/618 |
| 2009/0289710 A1* | 11/2009 | Hardy et al. | 330/251 |
| 2010/0041997 A1* | 2/2010 | Amemiya et al. | 600/459 |
| 2010/0113934 A1* | 5/2010 | Oguzman et al. | 600/459 |
| 2010/0164582 A1* | 7/2010 | Ricotti et al. | 327/208 |
| 2012/0268200 A1* | 10/2012 | Rossi | H03K 19/018521 327/574 |
| 2014/0055188 A1* | 2/2014 | Rossi | H03K 19/018521 327/321 |

* cited by examiner

SWITCHING CIRCUIT FOR A TRANSMISSION CHANNEL FOR ULTRASOUND APPLICATIONS, TRANSMISSION CHANNEL AND PROCESS FOR DRIVING A SWITCHING CIRCUIT

BACKGROUND

1. Technical Field

The present disclosure relates to a switching circuit for a transmission channel for ultrasound applications, inserted between a connection terminal and a low voltage output terminal and comprising a receiving switch.

The disclosure also relates to a transmission channel for ultrasound applications of the type comprising at least such a switching circuit and to a process for driving said switching circuit.

The disclosure particularly, but not exclusively, relates to a switching circuit suitable for being used by a transmission channel for ultrasound applications and the following description is made with reference to this field of application by way of illustration only.

2. Description of the Related Art

As it is well known, the sonography or ultrasonography is a system of mechanical diagnostic testing that uses ultrasonic waves or ultrasounds and is based on the principle of the transmission of the ultrasounds and of the emission of echo and is widely used in the internal medicine, surgical and radiological fields.

The ultrasounds normally used are comprised between 2 and 20 MHz. The frequency is chosen by taking into consideration that higher frequencies have a greater image resolving power, but penetrate less in depth in the subject under examination.

Substantially, an ultrasonographer, in particular a diagnostic apparatus based on the ultrasound sonography, comprises three parts:
  a probe comprising at least an ultrasonic transducer, in particular of the type realized by means of piezoelectric crystal, which is suitably biased for causing its deformation and the generation of an ultrasound signal or pulse;
  an electronic system that drives the transducer for the generation of the ultrasound signal or pulse to be transmitted and that receives an echo signal at the probe, processing in consequence the received echo signal; and
  a displaying system able to collect the return signal or echo and to generate a corresponding sonographic image starting from the echo signal received at the probe and shown on a monitor.

The piezoelectric transducer is equivalent to an electric circuit substantially comprising a capacitor, an inductance and a resistance inserted in series to each other.

A typical transmission/receiving channel or channel TX with three voltage levels used in these applications is schematically shown in FIG. 1 and indicated with 1A.

In particular, the transmission/receiving channel 1A comprises a level shifter 2A, of the type comprising a half-bridge 4 inserted between a first terminal HVP, connected to a positive voltage, and a second terminal HVM, connected to a negative voltage. The voltage of the output terminal HVout of the level shifter 2A is brought by a clamp block 5 to a reference voltage, which, in the present example, is the ground voltage GND.

The clamp block 5A is substantially a high voltage switch between said output terminal HVout of the level shifter 2A and said ground voltage GND, controlled by a first driving signal INC.

The output terminal HVout corresponding to a first output terminal of the transmission channel 1A, is connected to a connection terminal Xdcr for the piezoelectric transducer, to be driven through the transmission channel 1A.

Suitably, an anti-noise block 3, comprising two diodes connected in antiparallel, is inserted between the output terminal VHout of the level shifter 2A and the connection terminal Xdcr. The anti-noise block 3, known as anti-noise diodes, allows during the receiving step of the transmission channel 1A to release the parasitic capacitances of the half-bridge of the level shifter 2A from the connection terminal Xdcr, thus avoiding to influence the receiving signal.

A T/R switch 6A or receiving switch is inserted between the connection terminal Xdcr and a low voltage output terminal LVout of the transmission channel 1. During the receiving step of the transmission channel 1, the receiving switch 6A is activated and transmits the receiving signal to the low voltage output terminal LVout.

The low voltage output terminal LVout is connected to an amplifier LNA that allows to amplify the signals or echoes received by the piezoelectric transducer that are following to the pulses sent. The receiving signal, suitably processed, will allow to display an image on a screen, not shown in the figure.

It is to be noted that the receiving switch 6A is of the high voltage type even if the receiving signal is a signal generally with low voltage value, since the piezoelectric transducer connected to the transmission channel 1A detects small return echoes of ultrasound pulse signals.

It is desirable for the receiving switch 6A to meet two needs that are apparently in contrast with each other: it should be of the high voltage type during the transmission step of the transmission channel 1A, in which the level shifter 2A has a step of variable duration between tens and hundreds of nanoseconds, while during the receiving step it should be on always with low voltages, the receiving step can have a duration of some hundreds of microseconds.

Moreover, the receiving switch 6A and the clamp block 5A are generally realized in two separated chips, and in particular connected respectively in a receiving chip and in a transmission chip, or, if present in the same chip they are realized separately so as to correctly respond to the single specifications.

More in detail, according to an embodiment shown in FIG. 2, a clamp block 5B comprises two circuit branches in parallel to each other and inserted between the output terminal HVout and an inner node X1.

The first branch comprising a first buffer diode Db1 and a first clamping transistor Mc1, inserted in series to each other, and the second branch comprises a second clamping transistor Mc2 and a second buffer diode Db2, inserted in series to each other. The inner node X1 is connected to the ground voltage GND.

The first clamping transistor Mc1 is a high voltage transistor MOS and with channel N (HV NMOS) while the second clamping transistor Mc2 is a high voltage MOS transistor with P channel (HV PMOS) and the first and the second buffer diode, Db1 and Db2, are high voltage diodes (HV diode). The first and the second clamping transistors Mc1 and Mc2, have respective control terminals, or gates, connected to a first signal INC1 and to a second signal INC2 respectively through a first and a second input driver, B1 and B2.

This FIG. 2 also shows the drain/source equivalent parasite diodes, Dc1 and Dc2, of the clamping transistors, Mc1 and Mc2.

These two branches allow to clamp the output terminal HVout to the ground voltage GND both for voltage positive values and for voltage negative values. In particular, the first and the second diode, Db1 and Db2, and the parasite diodes, Dc1 and Dc2, allow to support positive and negative voltage values present on the output terminal HVout when the clamp block 5B is off, i.e. with the first and with the second driving signal, INC1 and INC2, deactivated.

The receiving switch 6B comprises a first receiving transistor Mr1, and a second receiving transistor Mr2 in series to each other and respectively connected to the connection terminal Xdcr and to the low voltage output terminal LVout of the transmission channel 1. The first receiving transistor Mr1 is a high voltage MOS transistor with P channel (HV PMOS) and the second receiving transistor Mr2 is a high voltage transistor MOS and with channel N (HV Nmos). The first and the second receiving transistor Mr1 and Mr2 have respective control terminals, or gates, respectively connected to a first signal INSW1 and to a second driving signal INSW2.

This FIG. 2 also shows the drain/source equivalent parasite diodes, Dr1 and Dr2 respectively of the first and of the second receiving transistor, Mr1 and Mr2.

As regards the operation of the receiving switch 6B, during the receiving step of the transmission channel 1 the two receiving transistors Mr1 and Mr2 are on. While, in the transmission step, the two receiving transistors Mr1 and Mr2 will have to be off and thus the respective control voltage, or gate-source voltage |Vgs|, will have to be null. Thus, in this step on the control terminal of the first transistor Mr1 and on the first control terminal, or source terminal (VSP), the positive voltage variations will follow the voltage variations of the connection terminal Xdcr.

The first and the second receiving transistor, Mr1 and Mr2 typically are sized so as to have a respective input resistance Ron compatible with the noise specifications preset.

The value of the input resistance Ron of the receiving switch 6B significantly affects the performances at the receiving.

In fact, the charge stored in the capacitor of the piezoelectric transducer is injected on the connection terminal Xdcr during the turn-on and receiving steps of the transmission channel 1B and this could cause noise and thus potential disturbances that affect the signal transmitted or received by the transmission channel 1 generating a malfunction.

Moreover, it is to be noted that, during the receiving step, the capacitor of the piezoelectric transducer is in parallel to the input resistance Ron of the receiving switch and thus could disturb the receiving signal received by the connection terminal Xdcr of the transmission channel 1B.

A transmission/receiving channel 1C with five voltage levels for ultrasound applications is shown in FIG. 3.

The transmission channel 1C, similarly to what has been previously shown and described, comprises a level shifter 2C connected to the output terminal HVout with a clamp block 5A and connected to a connection terminal Xdcr through an anti-noise block 3. Moreover, the output terminal HVout is connected to a low voltage output terminal LVout of the transmission channel 1C by means of a receiving switch 6A.

The level shifter 2C comprises a half-bridge 4 and a further half-bridge 4' inserted between two first terminals, HVP0 and HVP1, connected to two positive voltages, independent from each other, and two second terminals, HVM0 and HVM1, connected to two negative voltages, independent from each other.

The voltage present at the output terminal HVout of the level shifter 2C is brought through the clamp block 5A to a ground voltage GND, while the receiving switch 6A transmits the signal received by the connection terminal Xdcr to the low voltage output terminal LVout.

BRIEF SUMMARY

One embodiment of the present disclosure is a switching circuit that can be used in a transmission channel for ultrasound applications that allows to realize a low voltage receiving switch with improved performances and that also allows to reduce the integration area ensuring at the same time a correct transmission and receiving of the signal on the transmission channel and having such structural and functional features as to overcome the limits and the drawbacks still affecting the circuits realized according to the prior art.

One embodiment of the present disclosure is a switching circuit for a transmission channel for ultrasound applications inserted between a connection terminal and a low voltage output terminal and comprising a receiving switch. The switching circuit comprises a high voltage clamp circuit inserted between said connection terminal and a central node, a low voltage clamping switch inserted between said central node and a terminal connected to a reference voltage, said receiving switch being low voltage and being inserted between said central node and said low voltage output terminal, said clamping switch and said receiving switch being controlled in a complementary way with respect to each other.

Suitably, the clamp circuit comprises a first and a second switching transistor inserted between said connection terminal and said central node and having respective control terminals connected to a driving block, said first and second switching transistors being high voltage MOS transistors.

In one embodiment, the clamp circuit further comprises a third switching transistor connected to said connection terminal and to said first switching transistor and a fourth switching transistor connected to said second switching transistor and to said connection terminal, said third and fourth switching transistors being high voltage MOS transistors able to close themselves when said clamp circuit is active and to support high positive and negative voltages when said clamp circuit is not active.

The third and the fourth switching transistor have the respective equivalents or body diodes inserted in anti-series and have respective control terminals connected to said driving block, said third and fourth switching transistor being of the opposite type with respect to said first and second switching transistors.

Suitably, the driving block comprises an input circuit connected in turn to said clamp circuit through a driving circuit having a first and a second driving transistor inserted in a crossed way, between the control terminals of said first and second switching transistor.

The driving circuit comprises the first driving transistor inserted between the control terminal of said first switching transistor and the control terminal of said fourth switching transistor, and the second driving transistor inserted between the control terminal of said second switching transistor and the control terminal of said third switching transistor, said first and second driving transistor having respective control terminals connected to said reference voltage.

The first and the second driving transistor are high voltage MOS transistors, said first driving transistor being a high voltage MOS transistor with P channel (HV PMOS) while said second driving transistor being a MOS transistor with N channel (HV Nmos), said first and second driving transistor comprising respective first and second equivalent diode.

In one embodiment, the input circuit comprises a first circuit branch and a second circuit branch, in parallel to each other, inserted between a first and a second clamp supply voltage reference, said first circuit branch comprising a first inner node X1 connected to the control terminal of the first switching transistor and the second circuit branch comprising a second inner node connected to said control terminal of the second switching transistor.

The central node of said high voltage clamp circuit is connected to an inner node of a low voltage block comprising said clamping switch and said receiving switch, said clamping switch and said receiving switch being implemented as pass-gate circuits and being connected to a first node and to a second node, an inverter (inverting logic gate) being interposed between said first node and said second node, said first node receiving a driving signal.

The clamping switch comprises a first and a second clamping transistor inserted in parallel to each other between said inner node and said reference node and having respective control terminals connected to said first node and to said second node.

The receiving switch comprises a first and a second receiving transistor inserted in parallel to each other between said connection terminal and said inner node and having respective control terminals connected to said first node and to said second node.

One embodiment of the present disclosure is a transmission channel comprising a level shifter, a connection terminal, a low voltage output terminal, and at least one switching circuit electrically coupled between said connection terminal and said low voltage output terminal.

One embodiment of the present disclosure is a process for driving a switching circuit for a transmission channel for ultrasound applications inserted between a connection terminal and a low voltage output terminal and comprising a receiving switch, said process comprising:

a receiving step in which a receiving signal received in said connection terminal is transmitted to said low voltage output terminal with the activation of said receiving switch;

interposing a high voltage clamp circuit between said connection terminal and a central node associated with said receiving switch, realizing said receiving switch as low voltage switch and interposing a clamping switch between said central node and a terminal connected to a reference voltage, controlling in a complementary way with respect to each other said clamping switch and said receiving switch, and by comprising a clamping step in which said connection terminal is associated with said reference voltage with the activation of said clamping switch.

Suitably, the receiving step comprises a starting clamping step.

Advantageously, said starting clamping step has a variable duration according to the applications and in particular corresponding to some nanoseconds, while the receiving step has a duration corresponding to some hundreds of microseconds.

The characteristics and the advantages of the switching circuit, of transmission channel and of the process for driving a switching circuit according to various embodiments of the disclosure will be apparent from the following description of an embodiment thereof given by way of indicative and non limiting example with reference to the annexed drawings.

DETAILED DESCRIPTION

Figure 4:
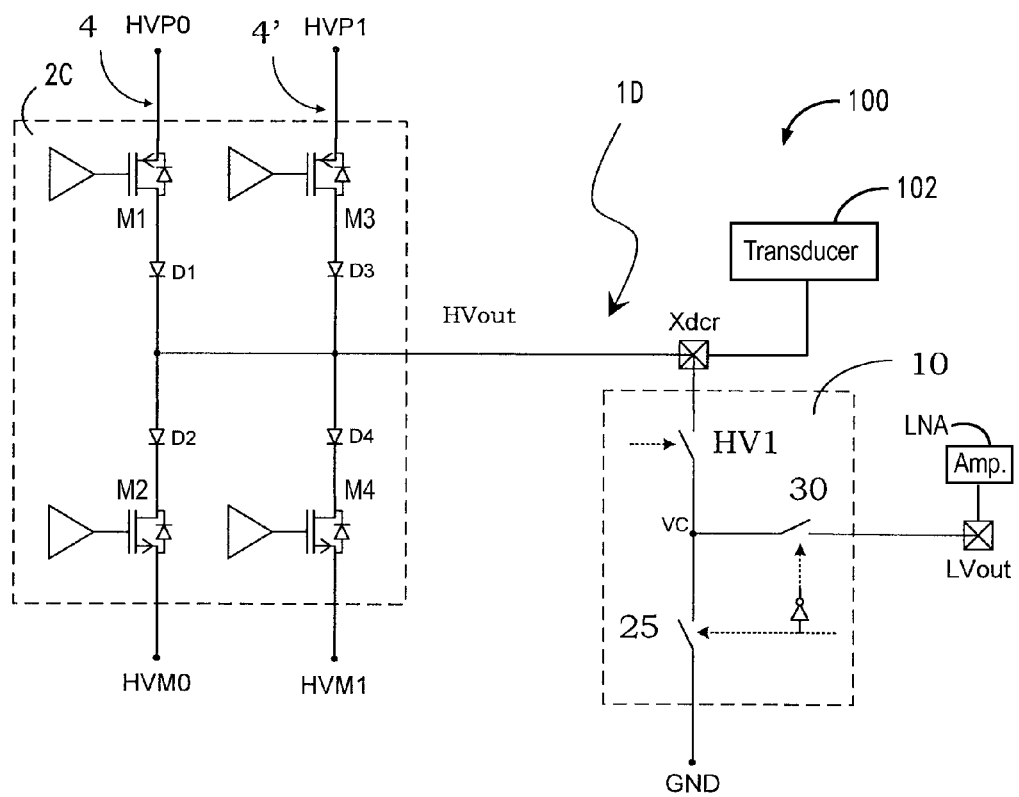
FIG. 4 schematically shows a switching circuit, that can be used, in particular, in a transmission channel for ultrasound applications, realized according to the disclosure.

Shown in FIG. 4 is ultrasound device 100 that includes a switching circuit 10 of a transmission channel 1D for ultrasound applications.

Figure 1:
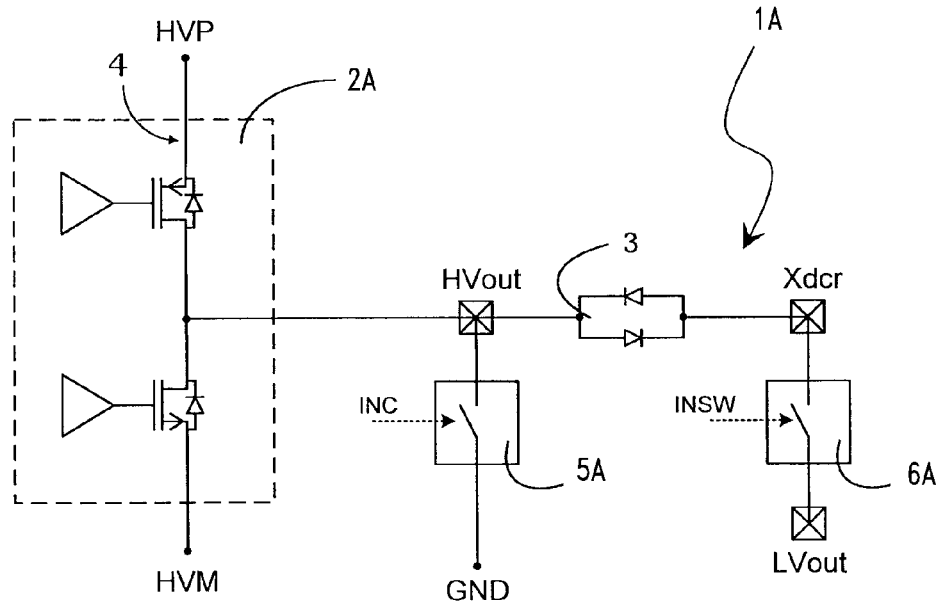
FIG. 1 schematically shows a transmission channel realized according to the prior art.
Figure 2:
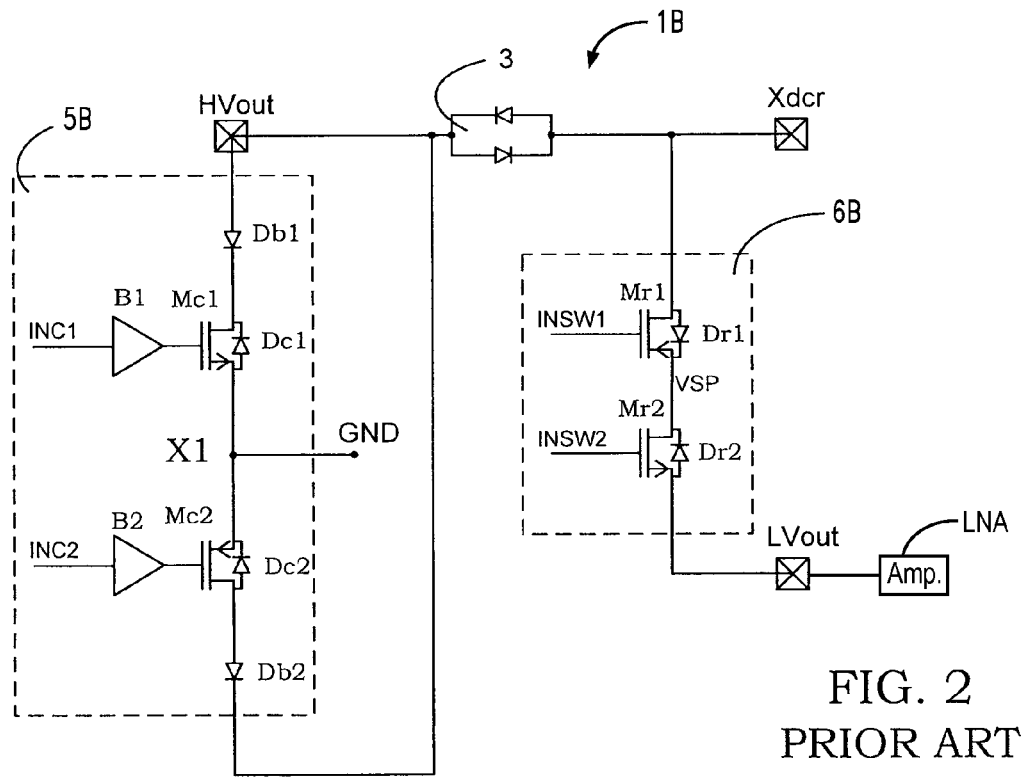
FIG. 2 shows an embodiment of a clamp block and of a TR-switch realized according to the prior art and used in a transmission channel of FIG. 1.
Figure 3:
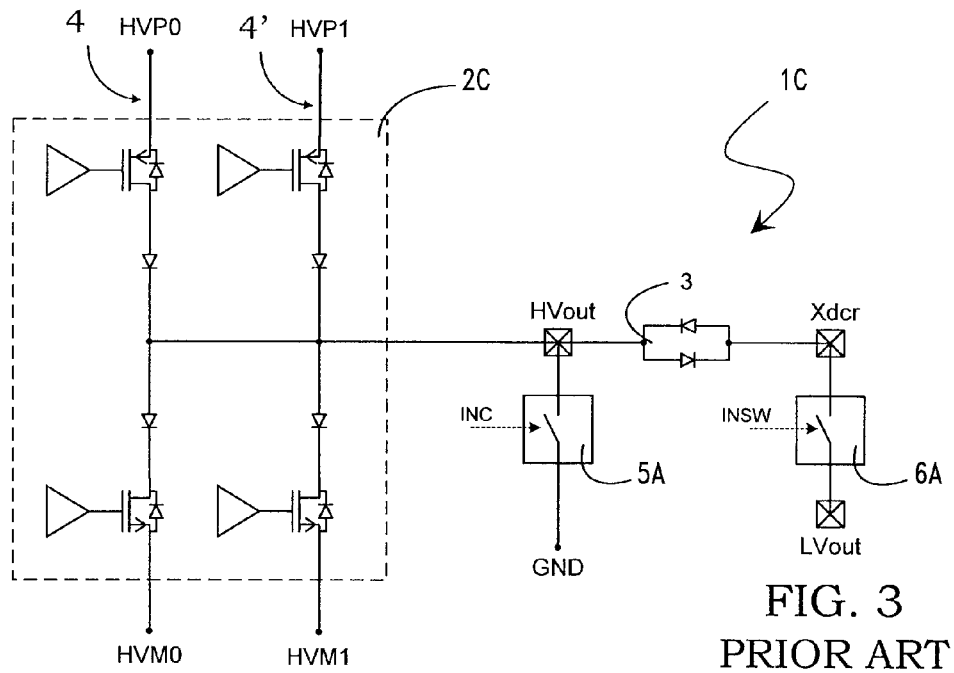
FIG. 3 shows a second embodiment of a transmission channel realized according to the prior art.

Elements that structurally and functionally correspond to the transmission channel described in relation to the prior art and shown in FIGS. 1, 2 and 3 will be given the same alphanumeric references for simplicity of illustration.

The transmission channel 1D is of the type with five voltage levels and comprises a level shifter 2C which in turn comprises a half-bridge 4 and a further half-bridge 4' connected to each other through an output terminal HVout which is connected to the connection terminal Xdcr for a piezoelectric transducer 102, to be driven by means of the transmission channel 1D.

In particular, the half-bridge 4 and the further half-bridge 4' are electrically coupled between two first terminals, HVP0 and HVP1, connected to two positive voltages, independent from each other, and two second terminals, HVM0 and HVM1, connected to two negative voltages, independent from each other. In particular, the half-bridge 4 comprises a first transistor M1 and a first diode D1, in series to each other, with the first transistor M1 connected to the first terminal with positive voltage HVP0 and the cathode of the first diode D1 connected to the output terminal HVout. The half-bridge 4 also comprises a second diode D2 and a second transistor M2 in series to each other, with the anode of the second diode D2 connected to the output terminal HVout and the second transistor M2 connected to the first terminal with negative voltage HVM0.

Similarly, the further half-bridge 4' comprises a third transistor M3 and a third diode D3, in series to each other, with the third transistor M3 connected to the second terminal with positive voltage HVP1 and the cathode of the third diode D3 connected to the output terminal HVout. The further half-bridge 4' also comprises a fourth diode D4 and a fourth transistor M4, in series to each other, with the anode of the fourth diode D4 connected to the output terminal HVout and the fourth transistor M4 connected to the second terminal with negative voltage HVM1. The switching circuit 10A is electrically coupled between the connection terminal Xdcr and a low voltage output terminal LVout of the transmission channel 1D.

The switching circuit 10 comprises a high voltage clamp circuit HV1 electrically coupled between the connection terminal Xdcr and a central node Vc, a low voltage clamping switch 25 electrically coupled between the central node Vc and a terminal connected to a ground voltage GND, and a low voltage receiving switch 30 electrically coupled between the central node Vc and the low voltage output terminal LVout. The low voltage output terminal LVout is in turn connected to an amplifier LNA which allows to amplify the receiving signals received by the connection terminal Xdcr during the receiving step, as it will be clearer hereafter in the description.

The clamping switch 25 and the receiving switch 30 are controlled in a complementary way with respect to each other, i.e., in counterphase.

Figure 5:
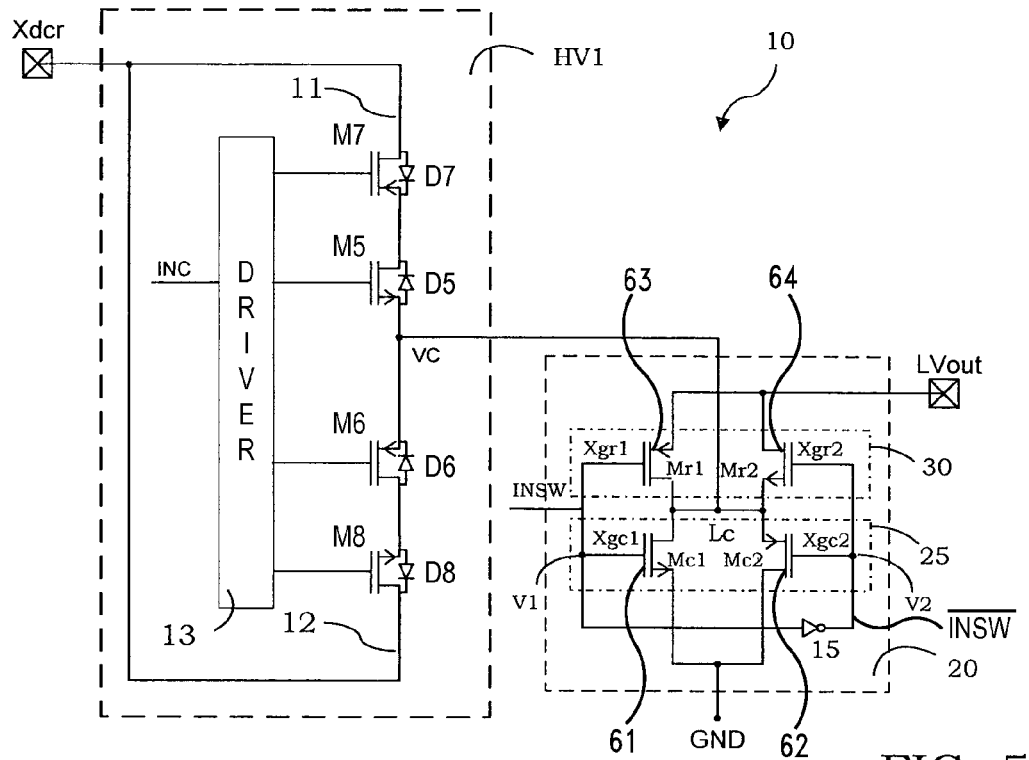
FIG. 5 shows, schematically and in greater detail, the switching circuit of FIG. 4.

According to an embodiment, shown in particular in FIG. 5, the high voltage clamp circuit HV1 comprises two circuit branches, 11 and 12, in parallel to each other, electrically coupled between the connection terminal Xdcr and the central node Vc and each comprising two high voltage HV transistors, one with channel N and one with channel P.

In particular, the first branch 11 comprises a first switching transistor M5 and the second branch 12 comprises a second switching transistor M6. The first and the second transistors, M5 and M6, are both high voltage MOS transistors with N channel (HV NMOS), are connected to the central node Vc and have respective first and second equivalent drain-source diode, D5 and D6, as indicated in Figure.

Advantageously, according to the disclosure, the first branch 11 also comprises a third switching transistor M7, electrically coupled in series to the first switching transistor M5 and connected to the connection terminal Xdcr, and the second branch 12 comprises a fourth switching transistor M8, electrically coupled in series to the second switching transistor M6 and also connected to the connection terminal Xdcr.

The third and the fourth switching transistor, M7 and M8, are high voltage MOS transistors of the opposite type with respect to the first and to the second switching transistor, M5 and M6. In the example of the figure, the third and the fourth receiving transistor, M7 and M8, are high voltage MOS transistors with channel P (HV PMOS) and respectively have a third and a fourth equivalent drain-source diode, D7 and D8. Suitably, the third transistor M7 and the fourth transistor M8 have the respective equivalents or body diodes D7, D8 in anti-series.

The first and the second switching transistor, M5 and M6, as well as the third and the fourth switching transistor, M7 and M8, have control terminals or gate terminals connected to a driving block 13.

In particular due also to the use of the suitable driving block 13, as it will be clarified hereafter, these third and fourth switching M7 and M8, are MOS transistors able to close themselves when the clamp circuit HV1 is active and to support high positive and negative voltages when the clamp circuit HV1 10 is not active and the transistors M5 and M6 are in open configuration.

Advantageously according to the present disclosure, the central node Vc of the high voltage clamp circuit HV1 is connected to an inner node Lc of a low voltage switching block 20. In particular, the low voltage switching block 20 comprises the clamping switch 25 and the receiving switch 30 both connected to a first node V1 and to a second node V2. An inverter or inverting logic gate 15 is interposed between the first node V1 and the second node V2, said first node V1 being associated with a driving terminal which receives a driving signal INSW from a controller (not shown) and produces a negated driving signal $\overline{INSW}$.

The clamping switch 25 is implemented as a pass-gate circuit and comprises a first clamping transistor 61 and a second clamping transistor 62 connected in parallel to each other and interposed between the inner node Lc and the ground terminal GND.

In particular, the first and second clamping transistors 61, 62 are low voltage MOS transistors and respectively of the type with an N channel (LV Nmos) and with a P channel (LV PMOS) and comprise respective control terminals, Xgc1 and Xgc2, connected to the first node V1 and to the second node V2 and driven in a complementary way with respect to each other by the driving signal INSW and by a negated driving signal $\overline{INSW}$, respectively.

The receiving switch 30 is also implemented as a pass-gate circuit but complementary with respect to the pass-gate circuit that implements the clamping switch 25.

In particular, the receiving switch 30 comprises a first receiving transistor 63 and a second receiving transistor 64 connected in parallel to each other and interposed between the inner node Lc and the low voltage output terminal LVout.

The first and second receiving transistors 63, 64 are low voltage MOS transistors and respectively of the type with P channel (LV PMOS) and with N channel (LV Nmos) and comprise the respective control terminals, Xgr1 and Xgr2, connected to the first node V1 and to the second node V2 and driven in a complementary way with each other by the driving signal INSW and the negated driving signal $\overline{INSW}$, respectively.

In this way, when the low voltage block 20 is active the clamping switch 25 or the receiving switch 30 are on in an alternated way with respect to each other.

When the clamping switch 25 is on, the central node Vc is thus brought to the ground voltage and maintained at this voltage due to the clamping transistors 61 and 62, both with the clamp circuit HV1 on and thus with the transmission channel 1D in the clamping step, and with the clamp circuit HV1 off and thus with the transmission channel 1D in the transmission step. This allows to avoid capacitive couplings that could generate disturbances both in the clamping step and in the transmission step.

When the clamp circuit HV1 is on and the receiving transistors 63 and 64 are on, driven by the driving signal INSW and the negated driving signal $\overline{INSW}$, respectively, the connection terminal Xcdr is connected to the low voltage output terminal LVout with the transmission channel 1D in the receiving step.

Figure 6:
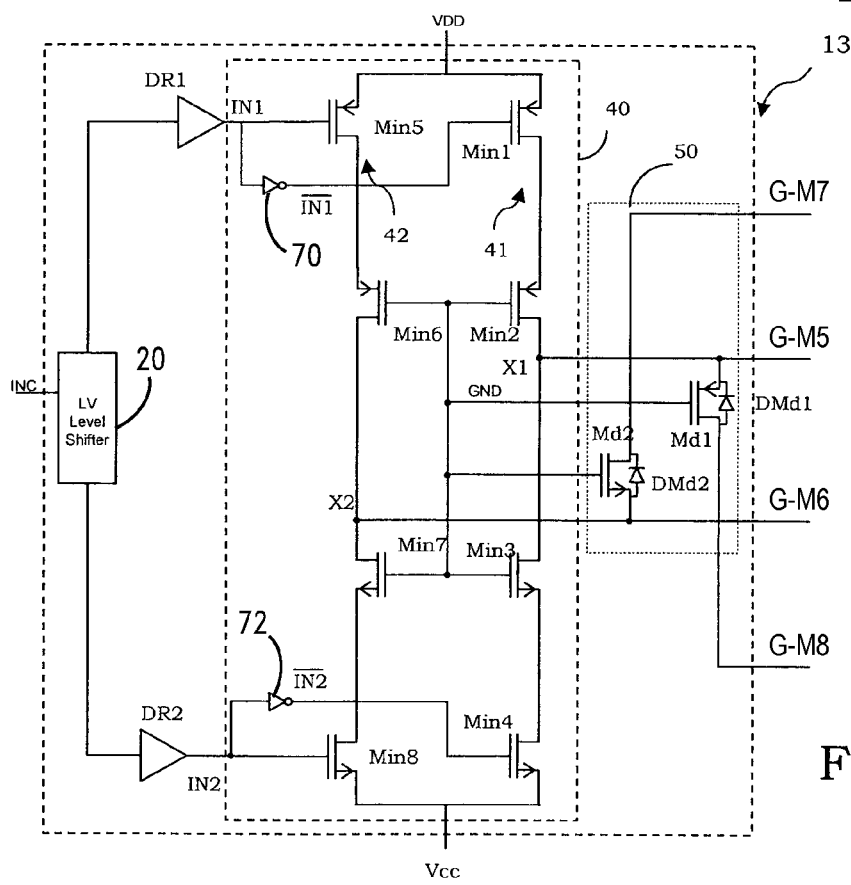
FIG. 6 shows a portion of the circuit of FIG. 5.

An embodiment of the driving block 13, of the high voltage clamp circuit HV1, is shown in FIG. 6.

The driving block 13 comprises an input circuit 40 connected in turn to the clamp circuit HV1 by a driving circuit 50 that drives the first and of the second switching transistors M5, M6 and suitable for closing the third and the fourth switching transistors M7, M8 when the clamp circuit HV1 is active.

In particular, the input circuit 40 comprises a first circuit branch 41 and a second circuit branch 42, in parallel to each other, electrically coupled between a first and a second clamp supply voltage reference, Vdd and Vcc. The first circuit branch 41 comprises a first inner node X1 connected to the control terminal G_M5 of the first switching transistor M5 and the second circuit branch 42 comprises a second inner node X2 connected to the control terminal G_M6 of the second switching transistor M6.

Advantageously, the driving circuit 50 comprises a first and a second driving transistor Md1 and Md2, electrically coupled in a crossed way, between the control terminals of the first and second switching transistors M5, M6.

In particular, the first driving transistor Md1 is electrically coupled between the first node X1 connected to the control terminal G_M5 of the first switching transistor M5 and a control terminal G_M8 of the fourth switching transistor M8. The second driving transistor Md2 is electrically coupled between the second node X2 connected to the control terminal G_M6 of the second switching transistor M6 and a control terminal G_M7 of the third switching transistor M7.

Further, the first and second driving transistors Md1 and Md2 have respective control terminals, or gates, connected to the ground voltage GND.

In particular, the first and second driving transistors Md1 and Md2 are high voltage MOS transistors of the type similar to the third and fourth switching transistors M7, M8, respectively. Even more in particular the first driving transistor Md1 is a high voltage MOS transistor with P channel (HV PMOS) while the second driving transistor Md2 is a MOS transistor with N channel (HV Nmos). These first and second driving transistors Md1 and Md2 have respective first and second equivalent diodes, DMd1 and DMd2, as indicated in the figure.

In this way, the driving circuit 50 ensures the turn-off of the third and fourth switching transistors M7, M8 during the transmission step of the transmission channel 1D. While, during the clamping step and during the receiving step, the driving circuit 50 correctly drives at high voltage the third and the fourth switching transistors M7, M8, forcing their closure, while the first and the second switching transistors M5, M6 are driven at low voltage (with voltage that varies between 0 and 3V) directly by the input circuit 40.

The input circuit 40 is driven by a first input driver DR1 and by a second input driver DR2, in turn connected to a level shifter 20, which is driven by an input signal INC from a controller (not shown).

The first and second drivers DR1 and DR2 generate respectively a first input signal IN1 and a second input signal IN2.

According to an embodiment, the first circuit branch 41 of the input circuit 40 comprises four transistors, Min1, Min2, Min3 and Min4, connected in series to each other.

In particular, the first and the second transistors, Min1 and Min2, are PMOS transistors electrically coupled between the first clamp supply voltage reference Vdd and the first inner node X1. The third and fourth transistors, Min3 and Min4, are NMOS transistors electrically coupled between the first inner node X1 and the second clamp supply voltage reference Vcc. The first transistor Min1 comprises a control terminal connected to the first driver DR1 through an inverting logic gate 70 and is thus driven by a negated version $\overline{IN1}$ of the first input signal IN1. The second transistor Min2 and the third transistor Min3 have control terminals connected to the ground voltage GND. The fourth transistor Min4 has a control terminal connected to the second driver DR2 through an inverting logic gate 72 and is thus driven by a negated version $\overline{IN2}$ of the second input signal IN2.

The second circuit branch 42 of the input circuit 40 comprises four transistors, Min5, Min6, Min7 and Min8, connected in series to each other.

In particular, the fifth and the sixth transistor, Min5 and Min6, are PMOS transistors electrically coupled between the first clamp supply voltage reference Vdd and the second inner node X2. The seventh and the eighth transistor, Min7 and Min8, are NMOS transistors electrically coupled between the second inner node X2 and the second clamp supply voltage reference Vcc.

The fifth transistor Min5 comprises a control terminal directly connected to the first driver DR1 and is then driven by the first input signal IN1. The sixth transistor Min6 and the seventh transistor Min7 have control terminals connected to the ground voltage GND. The eighth transistor Min8 has a control terminal connected to the second driver DR2 and is thus driven by the second input signal IN2.

In this way, the driving block 13 is highly performing due to the input circuit 40 and to the driving circuit 50 and ensures a delayed turn-on of the third and of the fourth switching transistors M7, M8 with respect to the first and second switching transistors M5, M6, so as to allow the central node Vc of the clamp circuit HV1 to exactly reach the value present at the connection terminal Xdcr.

In particular, the driving circuit 50 drives in high voltage the third and fourth switching transistors M7, M8, forcing their closure in the clamping step of the transmission channel 1, while the first and second switching transistors M5, M6 are driven at low voltage (with voltage that varies between 0 and 3 V) directly by the input circuit 40.

As regards the operation, during the first instants, the clamping step, due to the rapidity of the fronts of the signal present at the connection terminal Xdcr, is dominated by the total turn-on of the first and second switching transistors M5, M6 that allow the current to pass in the respective channel. At the same time, the current in the third and fourth switching transistors M7, M8 mainly passes in the respective drain/source equivalent parasitic diodes D7, D8.

During the transmission step of the transmission channel 1D, the clamp circuit HV1 and the receiving switch 30 are turned off, in particular, according to the present example, with the driving signals IN1=IN2=GND, while the clamping switch 25 remains on.

In this way, during the transmission step the switching circuit 10 allows to avoid capacitive couplings on the central node Vc which is connected to the ground voltage GND and also to avoid capacitive couplings of this central node Vc on the low voltage output terminal LVout, that could saturate the connected amplifier LNA.

During the clamping step: the clamp circuit HV1 and the clamping switch 25 are turned on so as to connect the connection terminal Xdcr to the ground terminal GND, while the receiving switch 30 is off.

During the receiving step: the clamp circuit HV1 and the receiving switch 30 are turned on so as to connect the connection terminal Xdcr to the low voltage output terminal LVout, while the switch 30 is off.

The sizing of the first and second switching transistors M5, M6 determines the switching speed towards the central node Vc of the clamp circuit HV1. After the starting instants of the switching, the driving circuit 50 allows the turn-on also of the third and fourth switching transistors M7, M8, so that the central node Vc follows exactly the signal at the connection terminal Xdcr. Moreover, with the third and fourth switching transistors M7, M8 on, the respective drain/source equivalent parasitic diodes D7, D8, in which during the first instants of the switching of the clamping step a big amount of current has passed, are discharged. During the clamping step the pass-gate 25, formed by the first and second clamping transistors 61, 62, is on and allows the connection of the central node Vc to the terminal connected to the ground voltage GND.

The central node Vc is thus tied to the ground voltage GND avoiding potential capacitive couplings.

Even more in particular, as regards the sizing of the clamp circuit HV1, the first and second switching transistors M5, M6 determine the rapidity of the switches during the clamping step and thus should have an adequate and symmetrical current range. Instead, the third and fourth switching transistors M7, M8, in series to the first and second switching transistors M5, M6, determine the output resistance Ron of the clamp circuit HV1 during the receiving step. For this reason, the third and the fourth switching transistors M7, M8 should be sized so as to obtain a desired value of the output resistance Ron that naturally depends on the design specifications.

Figure 7:
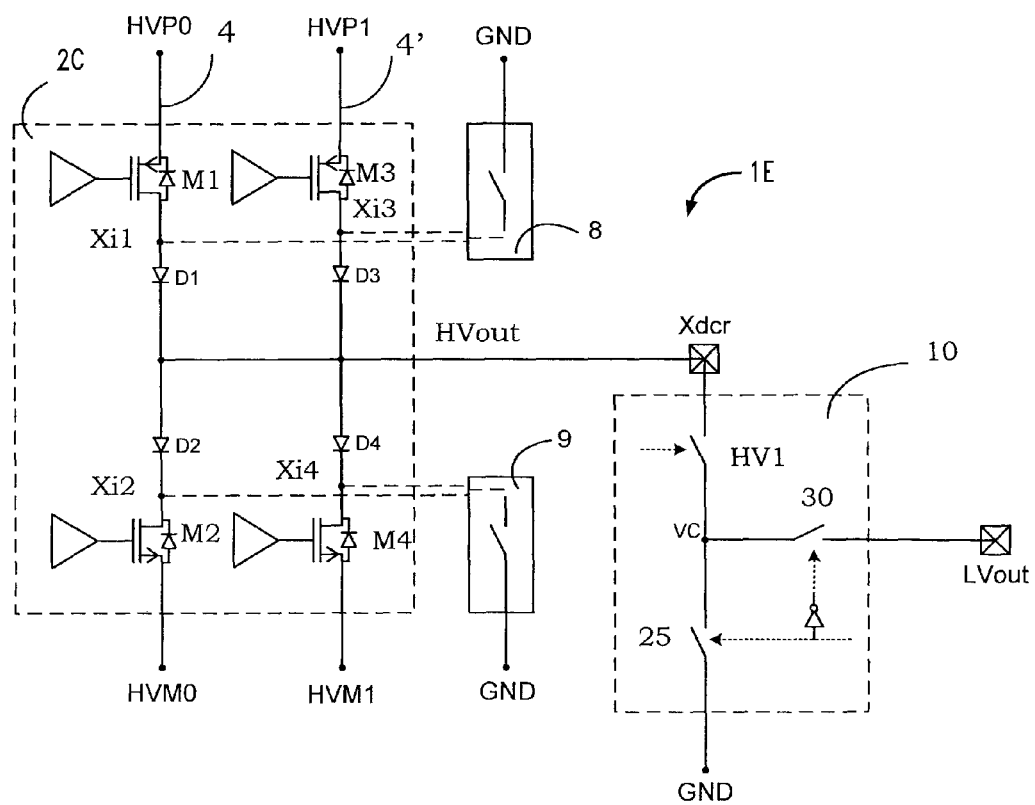
FIG. 7 shows a variant of a transmission channel comprising the switching circuit according to one embodiment of the present disclosure.

An embodiment of a transmission channel 1E with five voltage levels for an ultrasound application, comprising the switching circuit 10 according to the present disclosure, is shown in FIG. 7. In particular, the transmission channel 1E comprises the level shifter 2C directly connected to the output terminal HVout with the connection terminal Xdcr and, through the switching circuit 10, to the low voltage output terminal LVout.

A first switching circuit 8 and a second switching circuit 9 are connected to the level shifter 2 and suitably driven for bringing back to the ground voltage GND the diodes D1-D4 comprised in the level shifter 2.

In particular, the first switching circuit 8 has a first terminal connected to a node Xi1 interposed between the first transistor M1 and the first diode D1, a second terminal connected to ground GND, and a third terminal connected to a node Xi3 interposed between the third transistor M3 and the third diode D3.

The second switching circuit 9 has a first terminal connected to ground GND, a second terminal connected to a node Xi2 interposed between the second diode D2 and the second transistor M2, and a third terminal connected to a node Xi4 interposed between the fourth diode D4 and the fourth transistor M4.

Advantageously, the first and the second switching circuit 8 and 9 selectively allow to bring back the respective terminals to the ground voltage GND. In particular thus, the first and the second switching circuit 8 and 9 function as anti-noise filters for the transmission channel 1E and allow to eliminate the anti-noise block 3, present in the circuits of the prior art, for example in the circuits shown in FIGS. 1-3. Moreover, differently with respect to the anti-noise block of the prior art, which included diodes able to support a high current, due to the switching circuit 10, according to the present disclosure, the diodes D1-D4 of the level shifter 2, can be small or in any case of reduced sizes since the amount of charge present is reduced with respect to the prior art.

The present disclosure also relates to a process for driving the switching circuit 10 for a transmission channel 1D, 1E for ultrasound applications as previously described for which details and cooperating parts having the same structure and function will be indicated with the same reference numbers and acronyms.

In particular, the transmission channel 1D, 1E comprises a level shifter 2C having an output terminal HVout connected to a connection terminal Xdcr, while the switching circuit 10 is electrically coupled between the connection terminal Xdcr and the low voltage output terminal LVout and comprises the receiving switch 30.

The transmission channel 1D, 1E is driven according to a process that includes:
a transmission step in which a signal is transmitted from said output terminal HVout of the level shifter 2C to the connection terminal Xdcr;
a clamping step in which the output terminal HVout is connected to the ground voltage GND;
a receiving step in which a receiving signal received in said connection terminal Xdcr is transmitted to a said low voltage output terminal LVout.

According to the present disclosure, the receiving signal is transmitted via a high voltage clamp circuit HV1 between the connection terminal Xdcr and a central node Vc of the connection circuit 10. Moreover, the step is provided of transmitting the receiving signal from the central node Vc to the low voltage output terminal LVout via the low voltage receiving switch 30.

The clamping includes clamping the central node Vc to ground GND using the low voltage clamping switch 25 connected between the central node Vc and a terminal connected to the reference voltage GND.

The process provides to control, in a complementary way with respect to each other, the clamping switch 25 and the receiving switch 30.

This process provides that during said clamping step also the connection terminal Xdcr is associated with the reference voltage GND with the activation of the clamping switch 25.

In fact, due to the switching circuit 10 according to the present disclosure, the connection terminal Xdcr and the output terminal HVout of the level shifter 2C are directly connected to each other and thus during the clamping step, through the clamp circuit HV1 and the closure of the clamping switch 25, both terminals are simultaneously connected to the ground terminal GND.

The need is thus avoided of the anti-noise block 3 and thus the undesired accumulation of charge, there is also a reduction of the area used for the integration since the diodes of the anti-noise block are eliminated since no longer necessary.

Moreover, the receiving step, according to the process of the present disclosure, comprises an starting clamping step in which said connection terminal Xdcr is connected to said ground voltage GND, through the switching circuit 10 and in particular through the clamp circuit HV1 and the closure of the clamping switch 25.

According to some embodiments, in a receiving step, the starting clamping step has a duration of some nanoseconds, while, the duration of the receiving step can be also equal to a value of hundreds of microseconds.

Advantageously, the starting clamping step, in a receiving step, allows to discharge the possible residual charge present in the transmission channel 1, substantially improving the signal received by the low voltage output terminal LVout through the clamp circuit HV1 and the closure of the receiving switch 30.

One advantage of the switching circuit 10 is the great reduction of area with respect to the solutions of the prior art. In fact, in a single chip it is possible to realize the clamp circuit and the receiving switch that advantageously share a single high voltage, highly performing clamp circuit.

Another remarkable advantage of the switching circuit 10 is the simplicity of the driving having the possibility to realize, at low voltage, both the clamping switch and the receiving switch.

Another advantage of the switching circuit 10, is the reduction of the charge stored in the transmission channel it is connected to, with the elimination of the anti-noise block there is a greater efficiency of the transmission channel that reduces the power loss due to the charges accumulated in the transmission step in the anti-noise diodes and eliminating malfunctions connected to the load.

An advantage of a transmission channel comprising a switching circuit, according to the present disclosure, is the reduction of charge present in the low voltage output terminal LVout passing from the clamping step to the receiving step. In fact, the MOS transistors of the high voltage clamp circuit HV1 are on during this passage, with the capacitances between the control terminal and a conduction terminal, in particular gate-source, already charged. The single contribution of charge injection being due to the low voltage switch where however the transistors are smaller since they are of the low voltage type, i.e. LV.

Another remarkable advantage of the process according to the present disclosure is the accuracy of the signal received by the low voltage output terminal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switching circuit for a transmission channel for ultrasound applications, comprising:
a connection terminal configured to be electrically coupled to the transmission channel;
a low voltage output terminal;
a reference voltage terminal;
a high voltage clamp circuit electrically coupled between said connection terminal and an inner node, wherein the high voltage said clamp circuit comprises first, second, third, and fourth switching transistors, the first and third switching transistors being electrically coupled to each other between said connection terminal and said inner node, the second and fourth switching transistors being electrically coupled to each other between said connection terminal and said inner node, the first, second, third, and fourth switching transistors having respective control terminals and being high voltage metal oxide semiconductor (MOS) transistors, the third and fourth switching transistors being configured to support high positive and negative voltages when said clamp circuit is not active and being configured to close when the clamp circuit is active;
a low voltage clamping switch electrically coupled between said inner node and the reference voltage terminal;
a low voltage receiving switch electrically coupled between said inner node and said low voltage output terminal, said low voltage clamping switch and said receiving switch being configured to be controlled in a complementary way with respect to each other; and
a driving block electrically coupled to the control terminals of the first, second, third, and fourth switching transistors, wherein said driving block comprises:
an input circuit that includes:
first and second clamp supply voltage terminals configured to provide first and second clamp supply voltages; and
a first circuit branch and a second circuit branch, in parallel to each other and electrically coupled between the first and second clamp supply voltage terminals, said first circuit branch including a first inner node electrically coupled to the control terminal of the first switching transistor and the second circuit branch including a second inner node electrically coupled to said control terminal of the second switching transistor; and
a driving circuit electrically coupling the input circuit to said high voltage clamp circuit and including:
a first driving transistor electrically coupled between the control terminals of said first and fourth switching transistors and having a control terminal electrically coupled to the reference voltage terminal; and
a second driving transistor electrically coupled between the control terminals of said second and third switching transistors and having a control terminal electrically coupled to the reference voltage terminal.

2. The switching circuit according to claim 1, further comprising first and second body diodes connected in anti-series with the third and fourth switching transistors, respectively, the first and third switching transistors being of opposite type with respect to each other, and said second and fourth switching transistors being of opposite type with respect to each other.

3. The switching circuit according to claim 1, wherein said first driving transistor is a high voltage p-type metal oxide semiconductor (PMOS) transistor and said second driving transistor is a high voltage n-type metal oxide semiconductor (NMOS) transistor.

4. The switching circuit according to claim 1, wherein:
said low voltage clamping switch and said receiving switch are part of a low voltage block, are pass-gate circuits, and are electrically coupled to each other at first and second nodes;
the low voltage block includes an inverter electrically coupled between said first node and said second node; and
said first node is configured to receive a driving signal from a controller.

5. The switching circuit according to claim 4, wherein said low voltage clamping switch comprises first and second clamping transistors electrically coupled in parallel to each other between said inner node and said reference voltage terminal and having respective control terminals electrically coupled to said first node and to said second node, respectively.

6. The switching circuit according to claim 5, wherein said receiving switch comprises first and second receiving transistors electrically coupled in parallel to each other between said connection terminal and said inner node and having respective control terminals electrically coupled to said first node and to said second node, respectively.

7. A transmission channel comprising:
a level shifter;
a connection terminal;
a low voltage output terminal; and
a switching circuit that includes:
a reference voltage terminal;
a high voltage clamp circuit electrically coupled between said connection terminal and an inner node, wherein the high voltage said clamp circuit comprises first, second, third, and fourth switching transistors, the first and third switching transistors being electrically coupled to each other between said connection terminal and said inner node, the second and fourth switching transistors being electrically coupled to each other between said connection terminal and said inner node, the first, second, third, and fourth switching transistors having respective control terminals and being high voltage metal oxide semiconductor (MOS) transistors, the third and fourth switching transistors being configured to support high positive and negative voltages when said clamp circuit is not active and being configured to close when the clamp circuit is active;

a low voltage clamping switch electrically coupled between said inner node and the reference voltage terminal;

a low voltage receiving switch electrically coupled between said inner node and said low voltage output terminal, said low voltage clamping switch and said receiving switch being configured to be controlled in a complementary way with respect to each other; and a driving block electrically coupled to the control terminals of the first, second, third, and fourth switching transistors, wherein said driving block comprises:

an input circuit that includes:
first and second clamp supply voltage terminals configured to provide first and second clamp supply voltages; and
a first circuit branch and a second circuit branch, in parallel to each other and electrically coupled between the first and second clamp supply voltage terminals, said first circuit branch including a first inner node electrically coupled to the control terminal of the first switching transistor and the second circuit branch including a second inner node electrically coupled to said control terminal of the second switching transistor; and a driving circuit electrically coupling the input circuit to said high voltage clamp circuit and including:
a first driving transistor electrically coupled between the control terminals of said first and fourth switching transistors and having a control terminal electrically coupled to the reference voltage terminal; and
a second driving transistor electrically coupled between the control terminals of said second and third switching transistors and having a control terminal electrically coupled to the reference voltage terminal.

8. The transmission channel according to claim 7, wherein the switching circuit includes first and second body diodes connected in anti-series with the third and fourth switching transistors, respectively, the first and third switching transistors being of opposite type with respect to each other, and said second and fourth switching transistors being of opposite type with respect to each other.

9. The transmission channel according to claim 7, wherein:

said low voltage clamping switch and said receiving switch are part of a low voltage block, are pass-gate circuits, and are electrically coupled to each other at first and second nodes;

the low voltage block includes an inverter electrically coupled between said first node and said second node; and said first node is configured to receive a driving signal from a controller.

10. The transmission channel according to claim 9, wherein:

said low voltage clamping switch comprises first and second clamping transistors electrically coupled in parallel to each other between said inner node and said reference voltage terminal and having respective control terminals electrically coupled to said first node and to said second node, respectively; and said receiving switch comprises first and second receiving transistors electrically coupled in parallel to each other between said connection terminal and said inner node and having respective control terminals electrically coupled to said first node and to said second node, respectively.

11. An ultrasound device, comprising:
an ultrasound transducer; and
a transmission channel electrically coupled to the ultrasound transducer and including:
a level shifter;
a connection terminal electrically coupled between the level shifter and the ultrasound transducer;
a low voltage output terminal; and
a switching circuit that includes:
a reference voltage terminal;
a high voltage clamp circuit electrically coupled between said connection terminal and an inner node, wherein the high voltage said clamp circuit comprises first, second, third, and fourth switching transistors, the first and third switching transistors being electrically coupled to each other between said connection terminal and said inner node, the second and fourth switching transistors being electrically coupled to each other between said connection terminal and said inner node, the first, second, third, and fourth switching transistors having respective control terminals and being high voltage MOS transistors, the third and fourth switching transistors being configured to support high positive and negative voltages when said clamp circuit is not active and being configured to close when the clamp circuit is active;

a low voltage clamping switch electrically coupled between said inner node and the reference voltage terminal;

a low voltage receiving switch electrically coupled between said inner node and said low voltage output terminal, said low voltage clamping switch and said receiving switch being configured to be controlled in a complementary way with respect to each other; and a driving block electrically coupled to the control terminals of the first, second, third, and fourth switching transistors, wherein said driving block comprises:

an input circuit that includes:
first and second clamp supply voltage terminals configured to provide first and second clamp supply voltages; and
a first circuit branch and a second circuit branch, in parallel to each other and electrically coupled between the first and second clamp supply voltage terminals, said first circuit branch including a first inner node electrically coupled to the control terminal of the first switching transistor and the second circuit branch including a second inner node electrically coupled to said control terminal of the second switching transistor; and a driving circuit electrically coupling the input circuit to said high voltage clamp circuit and including:

a first driving transistor electrically coupled between the control terminals of said first and fourth switching transistors and having a control terminal electrically coupled to the reference voltage terminal; and a second driving transistor electrically coupled between the control terminals of said second and third switching transistors and having a control terminal electrically coupled to the reference voltage terminal.

12. The ultrasound device according to claim 11, further comprising a low noise amplifier having an input electrically coupled to the low voltage output terminal.

\* \* \* \* \*